United States Patent [19]

Guglielmi et al.

[11] 4,234,871
[45] Nov. 18, 1980

[54] CAPACITIVE KEYBOARD FOR DATA PROCESSING EQUIPMENTS

[75] Inventors: Nicolò Guglielmi, Turin; Giandomenico Dagna; Bruno Visentin, both of Ivrea, all of Italy

[73] Assignee: Ing. C. Olivetti & C., S.p.A., Ivrea, Italy

[21] Appl. No.: 913,217

[22] Filed: Jun. 6, 1978

[51] Int. Cl.³ .................. G06F 3/023; G08C 9/02
[52] U.S. Cl. ..................... 340/365 S; 200/DIG. 1; 340/365 C
[58] Field of Search .............. 340/365 C, 365 S; 200/DIG. 1, 180; 361/288; 307/88 ET; 400/479.1, 479.2, 477, 478, 479

[56] References Cited

U.S. PATENT DOCUMENTS

| | | | |
|---|---|---|---|
| 3,653,038 | 3/1972 | Webb | 340/365 C |
| 3,751,612 | 8/1973 | Hansen | 200/DIG. 1 |
| 3,797,630 | 3/1974 | Zilkha | 340/365 C |
| 3,900,712 | 8/1975 | Fukao | 340/365 C |
| 3,951,250 | 4/1976 | Pointon | 340/365 C |
| 3,965,399 | 6/1976 | Walker | 340/365 C |
| 3,968,488 | 7/1976 | Bovio | 340/365 C |
| 3,982,236 | 9/1976 | Kafafian | 340/365 S |
| 4,127,758 | 11/1978 | Lowthrop | 200/DIG. 1 |

Primary Examiner—John W. Caldwell, Sr.
Assistant Examiner—James J. Groody
Attorney, Agent, or Firm—Schuyler, Birch, McKie & Beckett

[57] ABSTRACT

In a capacitive keyboard using a polarized dielectric commonly called an electret, the keys are organized according to a matrix by rows and columns, the signals generated on the column conductors being of opposite polarity with respect to those generated on the row conductors. The movable armatures of the variable capacitors of the keys also act as bridging elements to allow the crossing of the row and column conductors and as snap elements.

8 Claims, 10 Drawing Figures

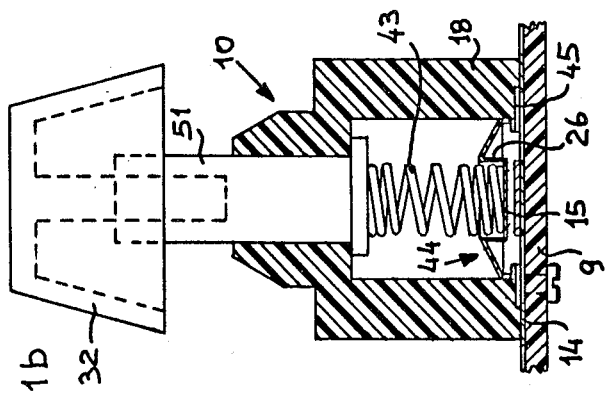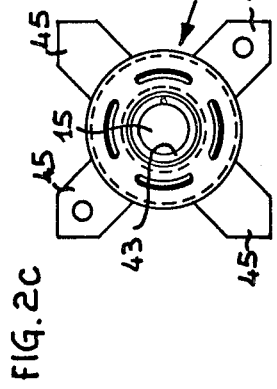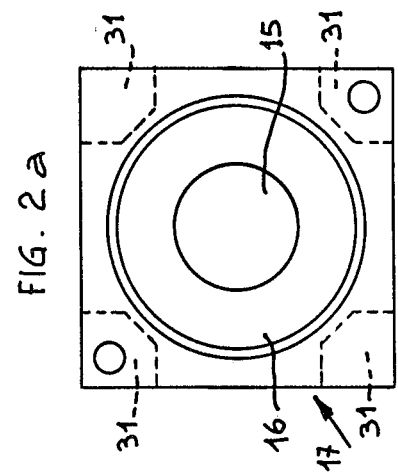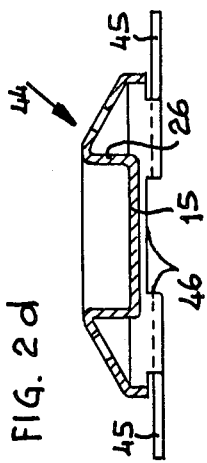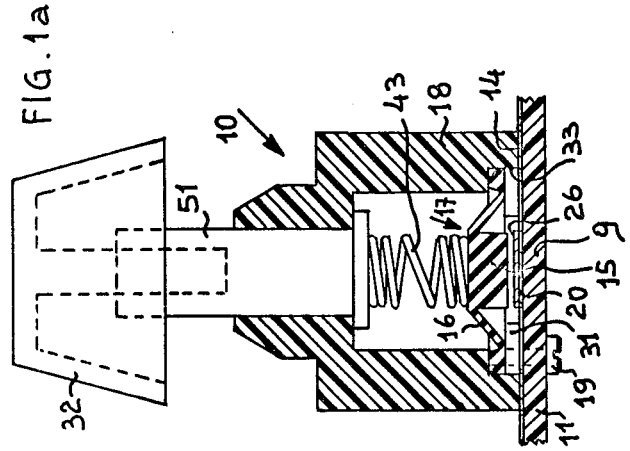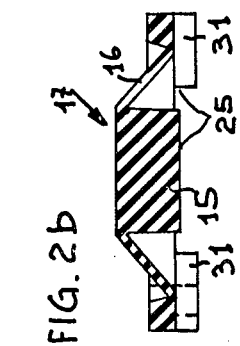

CAPACITIVE KEYBOARD FOR DATA PROCESSING EQUIPMENTS

BACKGROUND OF THE INVENTION

This invention relates to a capacitive keyboard for data processing equipments, having a variable capacitor associated with each key.

There are known capacitive keyboards, wherein each key comprises a variable capacitor with two armatures, one fixed and one movable with the movement of the key, with the interposition of a thin dielectric layer.

The recognition of the state of actuation of the capacitive keys and the generation of the corresponding codes are currently operated by means of devices known as KBE (KeyBoard Encoders), that require the connection of the armatures of the individual capacitive keys according to the rows and columns of a matrix.

In some known capacitive keyboards the fixed armatures and the movable armatures are separately connected by rows and columns respectively; while the connection of the fixed armatures obtained from a printed circuit-board is quite simple and inexpensive, the connection between the movable armatures, and their connection to the printed circuit board carrying the fixed armatures and the KBE is much more complicated.

In another known keyboard both armatures of the variable capacitors are obtained from the printed circuit board, by dividing in two halves the surface of the printed circuit board underlying each key, the variation of capacitance between the armatures effected by the displacement of a movable armature facing both halves. In this keyboard however, with the same dimensions of the keys, the variation in capacitance is considerably inferior as compared to the preceeding solution. Furthermore the connection of the two halves corresponding to each key by rows and columns unavoidably requires the crossing of the conductors, requiring the use of printed circuits with two faces considerably more expensive than the printed circuits with only one face.

In key boards using a polarized dielectric or electret, at the depression of a key, it is necessary to detect the pulses generated between the two armatures of the variable capacitors by electrostatic induction. Said pulses have opposite polarity on the two armatures of the variable capacitors, preventing the normal organization by rows and columns for the coding. In a known keyboard (U.S. Pat. No. 3,653,038), the fixed armatures of the variable capacitors are also divided in two halves, of which one is connected to the row and the other to the column system, while the movable armature is set at a common earth potential. However also this keyboard requires a two sided printed circuit board, because the row and column connections of the two halves of each key must cross.

The main object of the invention is to provide a keyboard having the advantages of reliability of the capacitive and electret keyboards and adapted to be manufactured at a low cost. This is achieved by drastically reducing the number of the component pieces and by the use of printed circuits with only one face.

SUMMARY OF THE INVENTION

According to the invention, we now provide a capacitive keyboard for data processing equipment, comprising a plurality of keys, a variable capacitor associated with each one of said keys, each capacitor comprising a fixed armature, an armature movable at the depression of the associated key, and a polarized dielectric material interposed between said armatures, and a keyboard encoder wherein the improvement comprises means for connecting the fixed armatures and the movable armatures according to a matrix by rows and columns, and means for applying the signals of opposite polarity generated upon depressing each key on one of said rows and one of said columns to the input of said keyboard encoder.

According to another embodiment of the invention a dielectric material is interposed between the armatures, said fixed armature is included in a printed circuit board, and said movable armature includes an element shaped out of a conductive material, said element including at least two extensions directly resting over terminals of said printed circuit board, so that said movable armatures also act as bridging elements on said printed circuit board.

BRIEF DESCRIPTION OF THE DRAWINGS

The following description represents some possible embodiments of the invention made by way of example and not as a limitation, with the help of the included drawing wherein:

FIG. 1a shows a partially sectional key according to a first embodiment of the invention;

FIG. 1b shows another partially sectional key according to another embodiment of the invention;

FIG. 2a is a plan view of the key of FIGS. 1a;

FIG. 2b shows in an enlarged scale a detail of FIG. 1a;

FIG. 2c is a plan view of a detail of FIG. 1b;

FIG. 2d shows in an enlarged scale a detail of FIG. 1b;

DESCRIPTION OF THE PREFERRED EMBODIMENTS

Figure 3:
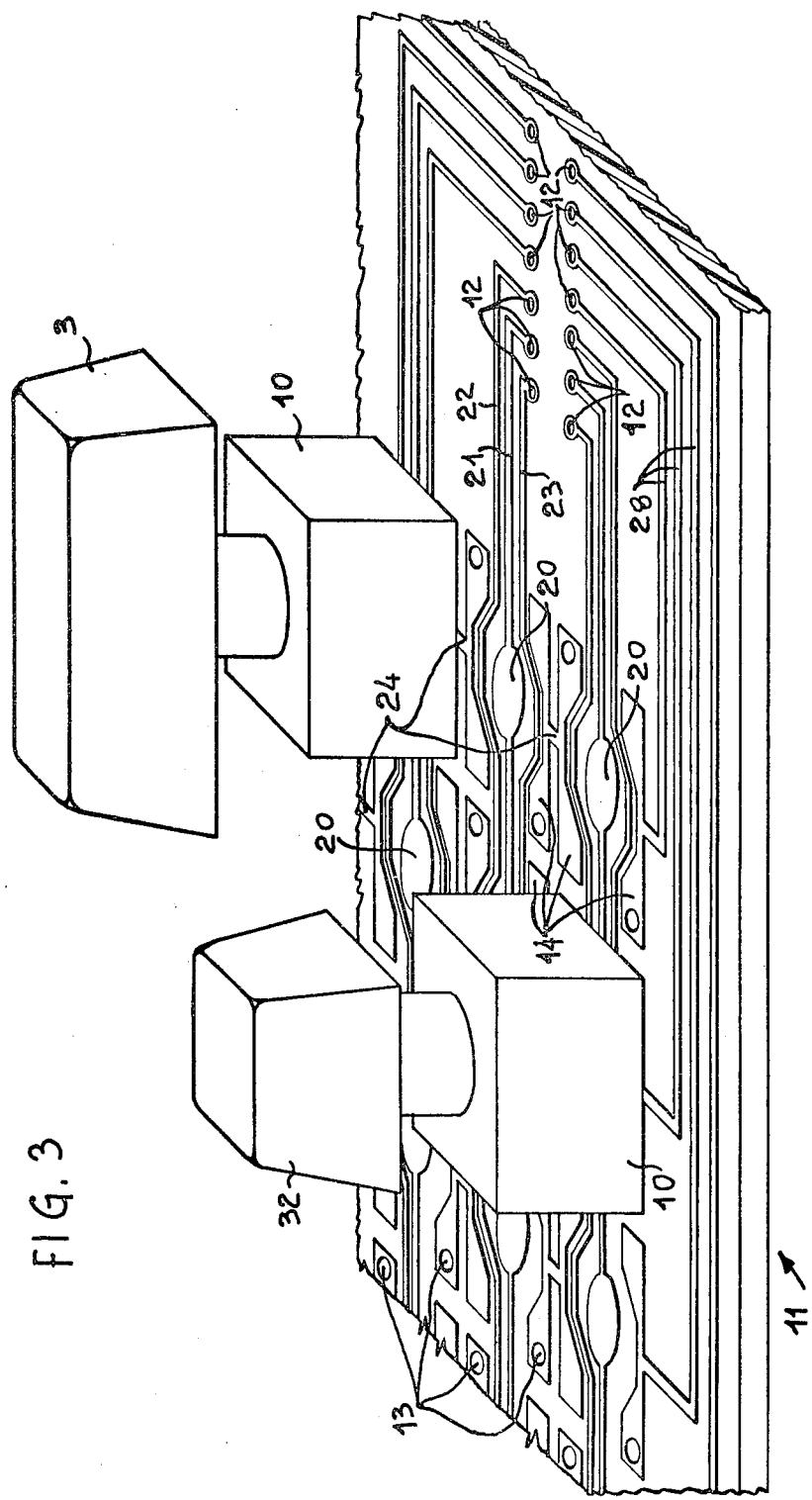
FIG. 3 is a perspective view of a particular of a keyboard according to the invention.

The capacitive keyboard according to the invention, can use both a polarized or non polarized dielectric. It comprises a printed circuit board 11 (FIG. 3) carrying capacitive keys 10 fastened for instance by means of screws 19 (FIG. 1a) passing through holes 13 (FIG. 3).

The printed circuit board 11 is of the type with only one face. On said face circular areas 20, are provided to be used as fixed armatures of the variable capacitors 9 (FIGS. 1a and 1b) of the capacitive Keys 10. In addition the connections required for the encoding, are provided in the same face. FIG. 3 shows as an example terminals 12 for the insertion of a KBE 4 (FIG. 5), with row connections 21, 22, 23 and column connection 28.

The column connections 28 are directed to terminals 14 lying under the capacitive keys 10. The terminals 14 of the same column are linked by connections 24, while the two terminals 14 of each key are connected by the key itself, as explained in the following. The areas 20 are interconnected according to the requirements of the KBE 4, the connections 22 and 23 with the areas 20 most distant from the KBE 4, pass in the space between the areas 20 and the terminals 14.

The same printed circuit board 11 can be used for different types of keyboard, its specialization being determined by the KBE 4. The capacitive keys 10 carry interchangeable caps 32. According to the requirements some special function keys may carry large caps 3 (FIG. 3).

FIG. 1a shows one of the possible solutions for the capacitive key 10. A hollow body 18 carries a stem 51 with the key cap 32. One of the areas 20 of the printed circuit board 11 (FIG. 3) constitutes the fixed armature of the variable capacitor 9, while a movable armature 15, made of an elastomeric conductive material, protrudes from a dome 16 of a key element 17. A spring 43 transmits to the element 17 the force applied to the cap 32. A dielectric layer 26, preferably of polarized material (electret), is interposed between the movable armature 15 and the fixed armature 20.

The structure of the capacitive key of FIG. 1a can be better understood with the help of FIGS. 2a and 2b. The element 17 is provided with four feet 31 that are 0.1 millimeter higher that the seat 33 of the body 18, in which they are inserted when the key 10 is mounted on the printed circuit board 11.

The feet 31 remain pinched exerting a high pressure against the terminals 14 of the printed circuit board, thus insuring a good electric contact between the element 17 and said terminals. On the other hand the undercut 25 (FIG. 2b) between the feet 31 insures the insulation of the element 17 with respect to the connections 21, 22, 23 (FIG. 3).

In this way the element 17 carrying the movable armature 15 of the variable capacitor 9, at the same time acts as a bridge connecting the two terminals 14 of each key 10, to allow the row connections 28 to cross the column connections 21, 22, 23, without requiring two-sided printed circuit boards with through connection.

Figure 4:
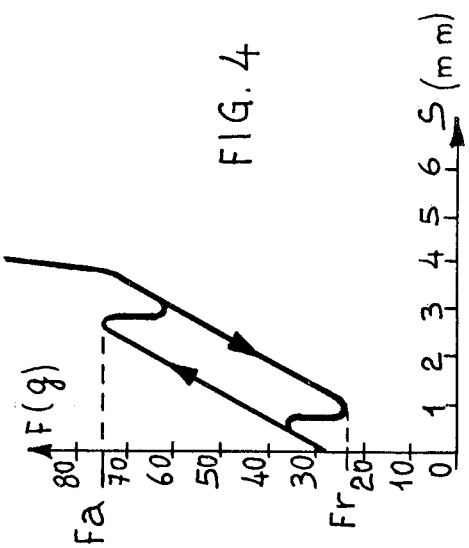
FIG. 4 is a diagram relative to the keys of FIGS. 1a and 1b.

The elements 17 further act as a snap element. The diagram of FIG. 4 shows the run S of the capacitive key 10 as a function of the force F applied to the cap 32, evidencing the mechanical hysteresis of the key. When the applied force exceeds a value Fa of approximately 80 g, the dome 16 yields abruptly, determining a fast approach of the movable armature 15 of the variable capacitor 9 to the fixed armature 20; the applied force must drop to a value Fr lower than Fa, at the release of the key, to restore the dome 16 to its orignial shape.

In the embodiment of FIG. 1b the capacitive key 10 includes a key element 44 provided with feet 45 and indents 46 obtained by punching and shaping a metallic sheet. The element 44 operates the same way as the element 17 as a movable armature 15 of the variable capacitor 9 and as a bridging and snapping element.

Figure 5:
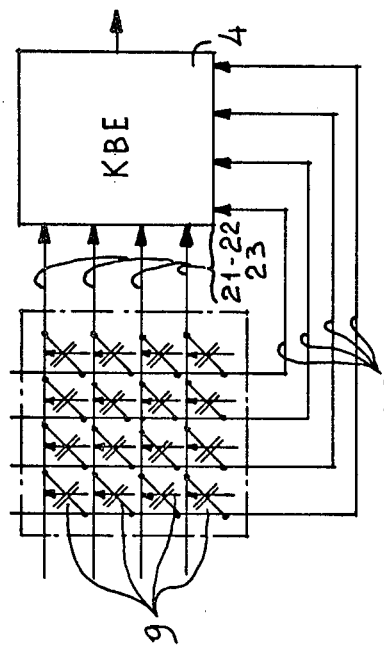
FIG. 5 is a diagram of a circuit relative to the keyboard of a FIGS. 1a and 1b.

When no polarized dielectric is used, the required coding circuit is schematically indicated in FIG. 5, including a commercially available KBE 4, providing interrogation pulses on the set of rows 21, 22, 23, and a detection system on the set of columns 28.

The crossing of the row and column connections of the printed circuit board has been avoided in the capacitive keyboard according to the invention, also when using a polarized dielectric (electret) without dividing in two halves the fixed armatures of the variable capacitors by using the signals of opposite polarity generated on the two armatures, which are respectively connected to a row and column system.

Figure 6:
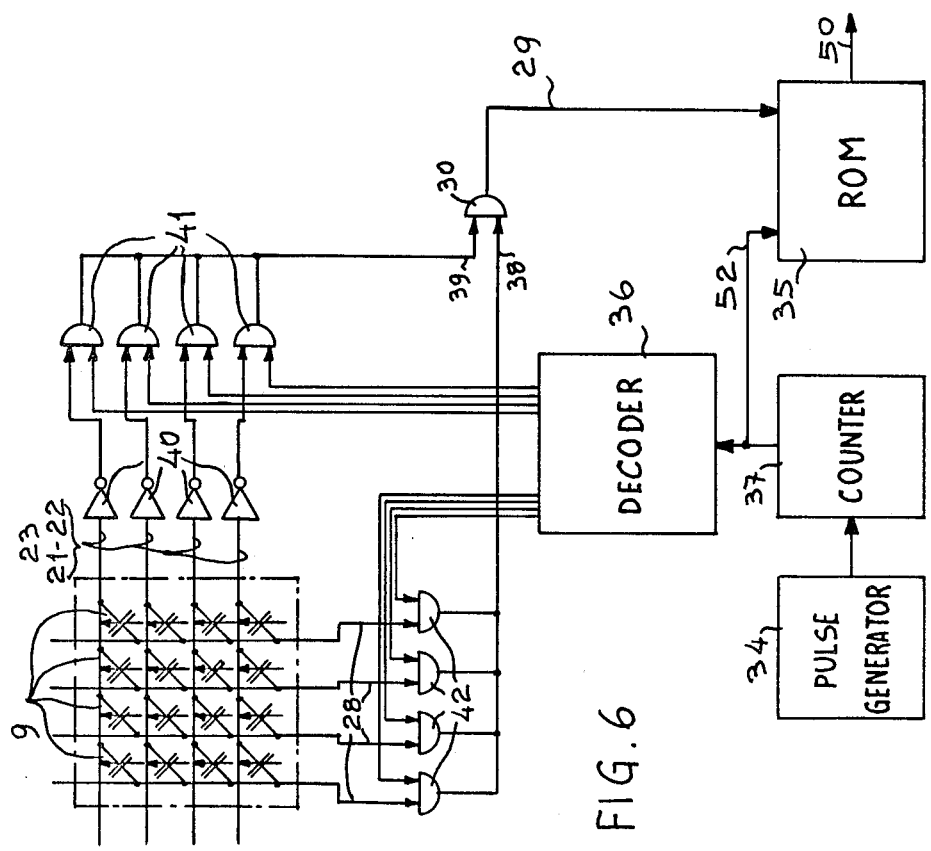
FIG. 6 is a diagram relative to a variant of the circuit of FIG. 5.

FIG. 6 shows an example of coded keyboard according to the invention wherein an electret is used.

The rows 21, 22, 23 are connected to AND gates 41 with the interposition of inverting circuits 40, while the columns 28 are directly connected to AND gates 42. The gates 41, 42 are cyclically sampled through a decoder 36, connected to a counter 37 counting the pulses of a high frequency pulse generator 34. The contemporaneous gating of one of the row gates 41 with each one the column gates 42 occurs only once for each counting cycle of the counter 37, so that counting position is associated to each key.

The duration of the pulses generated by the keys by electrostatic induction when the key is actuated is in the order of a millisecond.

The oscillating frequency of the pulse generator 34 is such that the complete counting cycle of the counter 37 takes less than said duration. In consequence, when a key is actuated, a coincidence signal is detected on both inputs 38 and 39 of an AND gate 30, in correspondence of the counting position associated to said key, said a coincidence signal 29 is generated. Said signal gates a coding ROM 35 to generate on an output 50 the code corresponding to the actuated key, on the base of the address determined by the position of the counter 37 through a connection 52.

A microprocessor may be used instead of the specialized encoder 36. In this case, if the microprocessor accepts negated inputs, the inverters 40 of FIG. 6 are not necessary.

The examples of capacitive keyboards, both with and without polarized dielectric, refer to modular solutions, that insure the maximum of flexibility, allowing to obtain different types of keyboards with a single type of keys 10 inserted in a standard printed circuit board or, in the worst case, only specializing the printed circuit board 11. It is however evident, without requiring a detailed description, that the same criteria indicated for the single capacitive key also apply for the construction of non modular keyboards, or of keyboards having a different modularity level, wherein the capacitive keys are arranged in mechanical blocks including more than one key.

What we claim is:

1. A capacitive keyboard for data processing equipment comprising:
   a plurality of keys,
   a keyboard encoder,
   a plurality of variable capacitors associated with said plurality of keys, said capacitors being arranged according to a matrix by a group of rows and a group of columns, each capacitor comprising a single-piece fixed armature, a single-piece movable armature adapted to be moved upon the depression of the associated key, and a polarized dielectric material interposed between said armatures, each capacitor upon the depression of the associated key generating on the corresponding armatures a pair of signals of opposite polarities,
   first connecting means for connecting the fixed armatures according to one of said groups of rows and columns of said matrix,
   second connecting means for connecting the movable armatures according to the other of said groups of rows and columns of said matrix,
   inverting means for inverting the signals of one of said groups of rows and columns of said matrix, and means for applying the signals so inverted and the signals of the other one of said groups to the input of said keyboard encoder.

2. A capacitive keyboard according to claim 1, wherein the encoding is operated by cyclically checking the coincidence of the signals appearing on one of the rows with those appearing on the columns of the matrix.

3. A capacitive keyboard according to claim 1, wherein said fixed armature is included in a printed circuit board, and said movable armature is shaped out of a conductive material and is integral with an element including at least two extensions directly resting over corresponding terminals of said printed circuit board, so that said movable armatures also act as bridging elements on said printed circuit board.

4. A capacitive keyboard according to claim 3, wherein said element is dome shaped, and each key when depressed is adapted to engage the top of said dome to cause its collapsing, whereby it causes a snap action in the actuation of the key.

5. A capacitive keyboard according to claim 3, wherein said conductive material is a conductive elastomeric material.

6. A capacitive keyboard for data processing equipment comprising a plurality of keys, a plurality of variable capacitors associated with said plurality of keys and arranged according to a matrix by rows and columns, each capacitor comprising a single piece fixed armature, a single piece armature movable upon the depression of the associated key, and a dielectric material interposed between the armatures, said fixed armatures being included in a printed circuit board, and being connected according to the rows and columns of said matrix, said printed circuit including a plurality of pairs of terminals arranged according to the columns or rows of said matrix, said movable armature including an element shaped out of a conductive material, and including at least two extensions directly resting over two corresponding terminals of said printed circuit board, so that said movable armatures effect a bridging on said printed circuit board.

7. A capacitive keyboard according to claim 6, wherein said element is dome shaped, and each key when depressed is adapted to engage the top of said dome to cause its collapsing, whereby a snap action is produced in the actuation of the key.

8. A capacitive keyboard according to claim 6, wherein said conductive material is a conductive elastomeric material.

* * * * *